United States Patent [19]

Constant et al.

[11] Patent Number: 4,677,988

[45] Date of Patent: Jul. 7, 1987

[54] METHOD AND APPARATUS FOR MEASURING MICROWAVE NOISE

[75] Inventors: Eugéne Constant; Yves Leroy, both of Villeneuve d'Ascq; Jean-Claude Van De Velde, Mons-en-Baroeul, all of France

[73] Assignee: Centre National de la Recherche Scientifique, Paris, France

[21] Appl. No.: 714,700

[22] Filed: Mar. 21, 1985

[30] Foreign Application Priority Data

Mar. 21, 1984 [FR] France .................. 84 04792

[51] Int. Cl.$^4$ ................ A61B 5/05; A61N 5/02
[52] U.S. Cl. .................. 128/736; 128/653; 374/122
[58] Field of Search ................ 374/122, 164; 128/736, 128/804, 653

[56] References Cited

U.S. PATENT DOCUMENTS

| | | | |
|---|---|---|---|
| 3,564,420 | 11/1967 | Webb | 374/122 |
| 3,777,270 | 12/1973 | Hardy et al. | 374/122 X |
| 4,106,340 | 8/1978 | Hamid | 374/122 X |
| 4,178,100 | 12/1979 | Frosch et al. | 374/122 X |
| 4,190,053 | 2/1980 | Sterzer | 374/122 X |
| 4,228,809 | 10/1980 | Paglione | 128/804 |
| 4,235,107 | 11/1980 | Ludeke et al. | 374/122 |
| 4,471,787 | 9/1984 | Bentall | 128/804 |

FOREIGN PATENT DOCUMENTS 0799726  8/1978  U.S.S.R. ................ 374/122

OTHER PUBLICATIONS

"Subcutaneous Temperatures: A Method of Noninvasive Sensing", Barrett et al, Science V 190-11/17/75, pp. 669-671.

Primary Examiner—Daniel W. Yasich
Attorney, Agent, or Firm—Robert E. Burns; Emmanuel J. Lobato; Bruce L. Adams

[57] ABSTRACT

The invention relates to an impedance adaptation control process in low noise reception chains and a miniature microwave thermometer of application of the said process. The process is used mainly in order to measure internal temperature by microwave thermography. The thermal radiation is picked up by means of an aerial (1) which provides a signal (2). This signal (2) is sent alternatively with a signal (5) coming from a standard source to a hyperfrequency amplifier (3) in order to compare the said signals (2,5) and to adjust the source (4) in consequence. According to the invention, in parallel, an additional impedance (15) is placed by intermittance in parallel to the input of the amplifier (3). By means of a synchronous detection (18) of the resulting signal (7), the impedance of the standard source (4) is adjusted so as to equal that of the aerial (1). The invention would, in particular, be applied for gauging the instruments for measuring the noise of dipoles and quadripoles such as microwave thermography.

10 Claims, 3 Drawing Figures

METHOD AND APPARATUS FOR MEASURING MICROWAVE NOISE

BACKGROUND OF THE INVENTION

The invention relates to a process of gauging and control of adaptation of impedance for low noise reception chains for a device for measuring microwave noise. The invention will be applied particularly in microwave thermography carried out in a monolithic integrated circuit for measuring the internal temperature of bodies.

The principle of microwave thermography for measuring temperature in depth of the order of some centimeters is well known. It is an item of equipment which comprises in particular an aerial which is intended to pick up the thermal radiation given out by a certain volume of the body to be examined.

It is known that there is a direct relationship between the microwave signal and the internal temperature of the body.

Several devices of this type have been developed, such as the Dicke radiometer in order to enable the thermal radiation to be analysed.

In general, the principle which is used may be summarised as follows: The hyperfrequency signal picked up by the aerial resulting from the thermal radiation of the object to be analysed which is in proportion to the temperature of the object is compared alternatively with a signal coming from a standard noise source or temperature resistance which is constantly checked and measured.

For this purpose, a switch controlled by an alternating LF (low frequency) signal makes it possible to "connect" the signal coming from the noise source or resistance or that coming from the hyperfrequency aerial alternatively at the input of a hyperfrequency amplifier.

The alternating signal which is received and detected at the output from the amplifier is thus in proportion to the temperature difference between that of the object to be measured and the source of noise. This signal may, therefore, constitute an error signal enabling the setting of the temperature of the standard noise source or resistance to be adjusted so as to achieve equality of the two temperatures. All that is then necessary is to read the adjusted temperature of the standard noise source or resistance in order to obtain that of the object to be measured.

It should, however, be noted that, in order to obtain an exact measurement of the temperature of the object, it is necessary to know exactly the impedance presented by the aerial which picks up the thermal radiation and to adjust strictly that of the noise source or resistance, the temperature of which should be adjusted and checked strictly.

In fact, the noise temperature of the amplifier depends on the impedance of the input device and it is, therefore, essential for the resistance of the aerial to be equal to that of the noise source or resistance.

At the present time, this measuring is extremely delicate and calls for a particularly delicate prior manipulation.

The purpose of the present invention is to present a process of impedance adaptation control for a low noise reception chain such as the radiometers used in microwave thermography which makes it possible, at all times, to ensure exact correspondence between the impedance presented by the aerial and the impedance presented by the standard temperature reference or source of noise.

SUMMARY OF THE INVENTION

According to the invention, the comparison of the impedances is done permanently throughout the experiment, thereby providing a great degree of reliability of the results of the measuring.

Moreover, in accordance with a preferential method of application of the process according to the invention, in the event of a variation of one impedance in relation to the other, the electric circuit applying the process immediately adjusts the impedance presented by the standard noise source in order to adjust this latter in relation to the impedance of the aerial.

There results from this a great simplification of use for the user of the systems according to the invention, who no longer has to concern himself during the experiment with the adaptation of the various impedances which are corrected automatically.

It must also be stressed that if, as a result of an error, the reception aerial for the thermal radiation were to be badly arranged and it presented a badly adapted impedance, the user or operator would be able to be warned thereof immediately and to carry out such adjustments as were called for.

Another purpose of the present invention is to present a miniature microwave thermometer for applying the process of the present invention. This minature thermometer is present in the form of a monolithic integrated circuit (IC) and, consequently, it is of extremely small dimensions.

Moreover, the whole of the components, including the aerial, are concentrated on one and the same circuit as a result of a special technological application.

Furthermore, the hyperfrequency amplifier which is used enjoys a special manufacturing structure which enables it to benefit from a very wide pass band with a considerably increased cut-out frequency as compared with the traditional embodiments.

Other purposes and advantages of the present invention will appear in the course of the following description which, however, is given only for purposes of information and which is not intended to restrict it.

The process of impedance adaption control for low noise reception chains such as microwave thermographs which are intended in particular for measuring the internal temperature of objects in which the thermal radiation of the said object to be examined is picked up by means of an aerial or antenna and the signal which is received is compared with the signal broadcast by a standard noise source, the temperature of which is adjustable, is characterised by an additional impedance being placed in parallel alternatively with the aerial and with the standard source and a comparison being made between the influence exerted by the additional impedance on the aerial and on the source of noise so as to adjust the aerial or the source of noise in order to equalise the influences.

The miniature microwave thermometer for applying the process under the invention, which comprises an aerial and a standard noise source connected by a switch piloted at an $F_o$ frequency and, an amplifier followed by a synchronous $F_o$ frequency detector which enables the temperature of the standard source to be adjusted by the analysis of the output signal is characterised by the fact that it presents an auxiliary circuit which periodically, in accordance with an $F_1$ frequency, places an additional impedance at the terminals of the amplifier and which analyses the resulting signal at the switch outlet.

BRIEF DESCRIPTION OF THE DRAWING

The invention will be understood better from a reading of the following description, accompanied by the attached drawings, in which.

DESCRIPTION OF THE PREFERRED EMBODIMENTS

The present invention is aimed at a process of impedance adaptation control for a low noise reception chain and miniature microwave thermometer. The description of the process is applied to microwave thermography; however, the invention may be applied to any measuring device which uses as an analysis principle the comparison between the signals broadcast by a reference source and the source to be studied.

Figure 1:
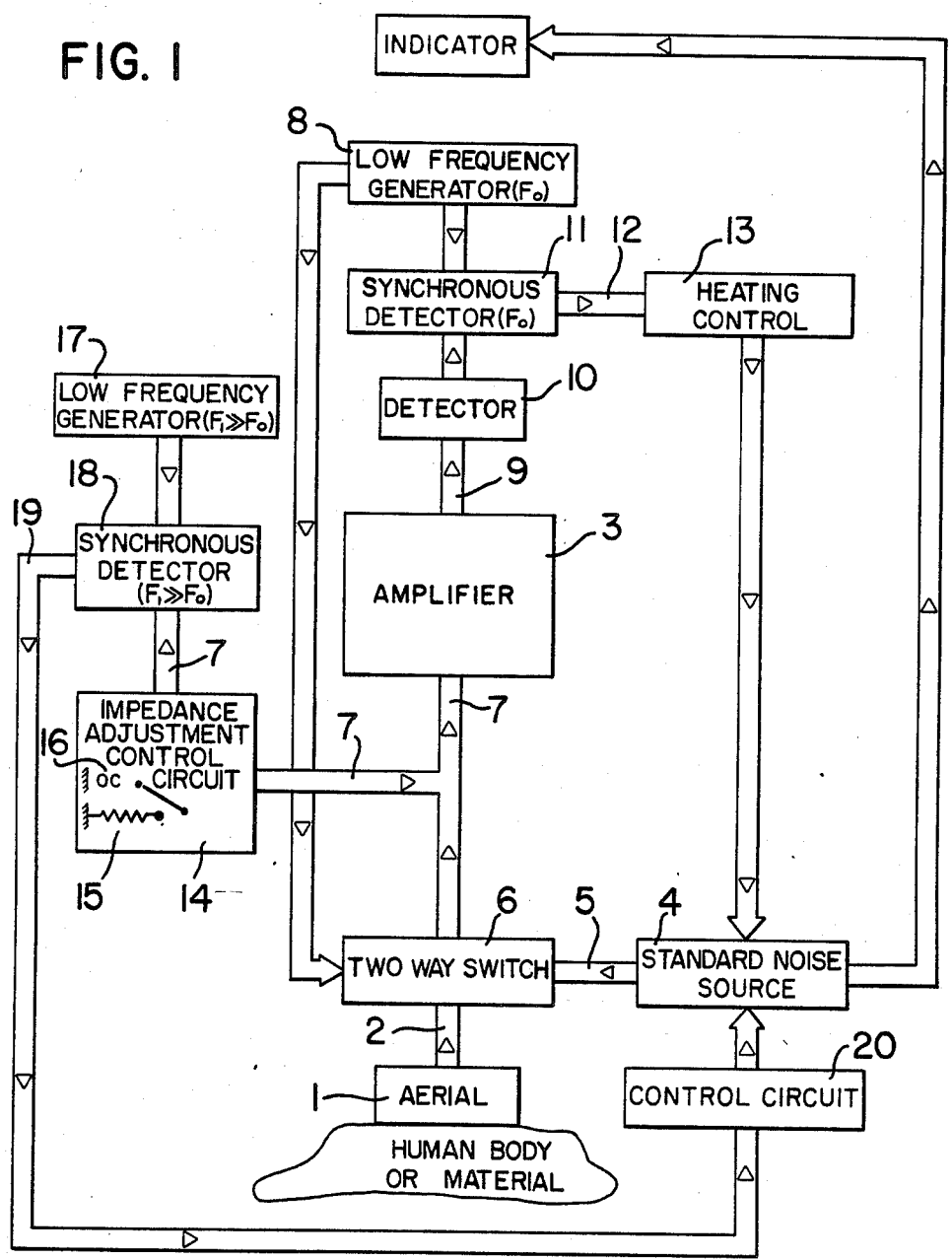
FIG. 1 shows in diagram form the working principle of an impedance adaptation control circuit for a low noise reception chain according to an application of the process of the present invention.

FIG. 1 shows in diagram form the working diagram of a microwave thermography radiometer.

The measuring of the internal temperature of a body which is grammatically illustrated is done by means of an aerial or antenna laid onto the body which picks up the thermal electro-magnetic radiation given out by the body.

This thermal radiation is in proportion to the temperature of the body and, moreover, the aerial picks up the signals broadcast according to a certain volume which corresponds to an internal part of the body, thereby making it possible to take a measurement of the temperature at a depth of the order of some centimeters.

The signals 2 which are picked up by the aerial are directed towards an amplifier 3. Moreover, a standard noise source 4 which generally consists of a resistance also delivers a signal 5 in proportion to the temperature of the standard noise source 4.

This signal 5 is also directed towards the amplifier 3 via a two way switch 6 which alternatively connects the input 7 of the amplifier 3 to the aerial 1 or to the standard source of noise 4 so that the amplifier is fed with the signal 2 or with the signal 5. The reference temperature source 4 is also connected to an indicator as shown which displays the temperature thereof.

The two way switch 6 if piloted by a low frequency generator 8 which delivers an $F_o$ frequency to the switch 6.

In this way, at the amplifier output 9, a signal is obtained the amplitude of which is in proportion to the difference in level or amplitude presented by the signals 2 delivered by the aerial and the signals 5 delivered by the standard noise source or resistance 4.

The signal 9 at the output from the amplifier 3 is directed towards a detector 10 which indicates to the user or operator whether there is equality between the temperatures measured by the aerial 1 and the reference temperature of the standard source 4. It appears thus that the signal 9 at the amplifier output corresponds to an "error" signal which the operator must attempt to cancel by adjusting the heating of the standard noise source or resistance 4 in order to equalise the same with the temperature of the body, the thermal radiation of which is picked up by means of the aerial 1.

It is possible to improve the process described above by arranging as a detector outlet 10 an $F_o$ synchronous frequency detector 11 piloted by the LF or low-frequency generator 8. The synchronous detector 11 functioning as synchronizing means delivers a signal 12, which is in direct proportion to the temperature difference presented between the body being examined and the standard noise source or resistance which, by means of a heating control circuit 13, makes it possible to adjust the temperature of the standard noise source or resistance 4 in order to obtain a nil error signal 9.

It should, however, be noted that an exact measurement of the temperature of the body which is being examined calls for an exact knowledge of the adaptation or impedance presented by the aerial 1 which picks up the thermal radiation given out by the said body. In fact, the noise temperature of the amplifier depends on the impedance of the input device and it is, therefore, essential for the resistance of the aerial to be equal to the noise source or resistance. When the process under the present invention is applied, it is possible to control this equality permanently.

According to the process under the present invention, an additional impedance of human value is placed alternatively sometimes in parallel with the aerial 1 and sometimes with the standard noise source and the influence exerted by the additional impedance on the aerial and on the noise source is compared, so as to adjust the aerial or the noise source in order to equalise these influences and, as a consequence, the impedances presented by the aerial and the standard noise source or resistance 4.

According to the invention, provision is made for impedance matching of the antenna 1 and the standard noise source 4, there is placed at the input of the amplifier 3 an impedance adaptation control circuit 14 functions as an impedance control means which sometimes places an impedance 15 at the input of the amplifier 3 and sometimes places itself in open circuit (OC) 16. Therefore, periodically, an additional impedance 15 is placed at the input of the amplifier 3. The control circuit of the impedance is piloted by a low frequency generator 17 which delivers an $F_1$ frequency signal which ensures the switch over of the impedance 15 and of the open circuit 16.

The application of a periodic additional impedance at the input terminals of the amplifier 3 results immediately in modifying the input signal 7 of the amplifier.

This modified input signal 7 is analysed by a synchronous detector 18 which is piloted by the low frequency generator 17 which delivers an output signal 19 to insure the antenna and temperature reference source are effectively impedance matched.

For the process to work properly, it should be noted that it is desirable for the $F_1$ frequency to be clearly greater than the $F_o$ frequency delivered by the generator 8.

The signal 19 is in effect a second error signal which corresponds to an impedance signal in direct proportion to the difference between the impedances presented by the aerial 1 and the standard noise source or resistance 4. Consequently, in order to optimalise the process, this signal 19 is directed towards a control circuit 20 which is means for adjusting or modifying the impedance adaptation presented by the standard noise source or resistance 4 so as to equalize this latter with that presented by the aerial 1.

The adaptation control circuit 14 is presented as a switch controlled by an alternating voltage of an $F_1$ frequency which enables an additional capacity or resistance to be put alternatively into parallel on the input of the hyperfrequency amplifier 3. In this way, the input impedance seen by the amplifier, with a noise temperature $T_R$, is modified alternatively but it should be noted that this modification of impedance or of the noise temperature $T_R$ will not necessarily be the same, depending on whether the aerial or the noise resistance is connected to the input of the amplifier and it is only in the event of the noise resistance 4 and the aerial 1 having the same impedance that the impedance modification will be identical. It is, therefore, sufficient to detect at the output from the amplifier the $F_1$ alternating frequency signal in order to obtain an error signal which is in proportion to the impedance difference between the noise resistance 4 and that of the aerial 1. The error signal may then be used to modify the value of the noise resistance so that it remains equal to that of the aerial or, more simply, when it is beyond a certain threshold, to send out a message to the experimenter or user of the apparatus to indicate that the aerial is badly adapted.

This impedance adaptation control process which can be applied to any low noise reception chain has been taken over in order to produce a miniature microwave thermometer according to the invention.

Figure 2:
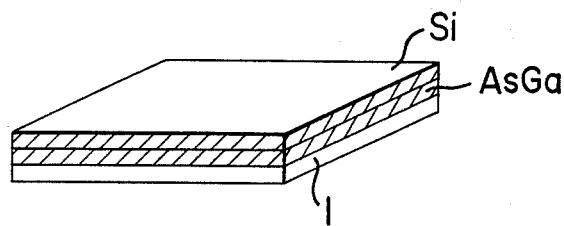
FIG. 2 shows in diagram form the circuit of the microwave thermometer according to the present invention.
Figure 3:
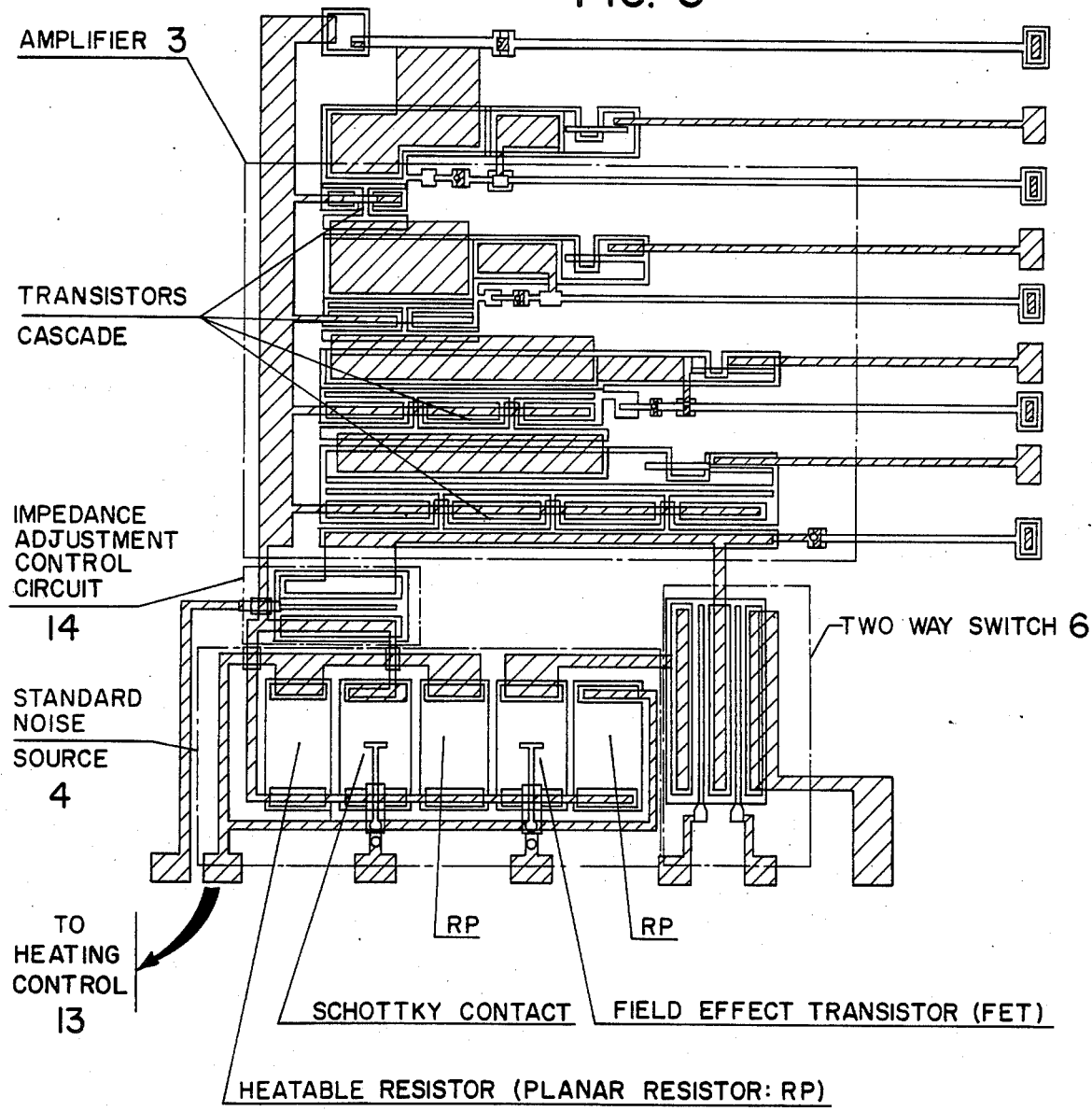
FIG. 3 illustrates the internal structure of the integrated circuit used for the embodiment of the miniature micro-wave thermometer according to the present invention.

The miniature microwave thermometer is produced in accordance with the diagrams illustrated in FIGS. 2 and 3. It is a thermometer produced with an integrated circuit is monlithic technology which uses the epitaxy layers n+n on semi-insulation made of semi-conductor of the 111-V type such as in AsGa, for example.

Aerial 1 is placed on the lower part of the circuit. In this way, the whole unit is designed in an integrated manner.

The active basic element consists of transistors with a field effect using a Schottky contact grid.

For preference, the resistance forming the standard noise source will be made in a planar form consisting of an epitaxy layer between two ohmic contacts.

The heating control 13 which enables the temperature of the standard noise source 4 to be modified is, for preference, produced by means of heating resistances framing the noise resistance or arranged in its immediate proximity. The distance will be of the order of a few microns.

The device for measuring the temperature of the standard noise source 4 uses the variations in the voltage current characteristic of a semi-conducting metal contact as a function of the temperature.

The device for checking the value of the standard noise source or resistance 4 uses the modification of the thickness of the resistance layer from a Schottky contact grid, the applied voltage of which is made to vary.

The hyperfrequency amplifier 3 illustrated in FIG. 3 must present a maximum pass band and, moreover, must be of as simple a design as possible.

The solution envisaged in order to achieve this objective is to use a common source fitting and to connect the drain to the grid in the next stage by a simple connection capacity. One of the most important factors which restricts the pass band in this configuration is the fact that the input admittance (capacitive) of a given stage in the amplification chain becomes greater, when the frequency increases, than the outlet admittance (conductive) of the previous stage.

The cut-out frequency is, therefore, of the form:

$$f_c = \frac{g_{di}}{2\pi C_{di+1}}$$

in which $g_{di}$ is the output admittance of stage i and $C_{di+1}$ is the input capacity of stage i+1.

In order to increase $f_c$, it is, therefore, necessary to reduce $C_{di+1}$ in relation to $g_{di}$. The solution which is proposed by the present invention is to use transistors with a decreasing dimension (the width) field effect. In this way, with the input capacity and the outlet conductance being in proportion to this width, the cut-out frequency may, therefore, be increased.

Other applications of the present invention which are within the grasp of members of the profession could have been envisaged without going outside the context of the same.

We claim:

1. A device for measuring thermal microwave radiation of an object for measuring the internal physical temperature of the object including a human or animal body comprising, an antenna to pickup thermal microwave electromagnetic radiation of the object and convert it into a received signal proportional to the temperature of the object, an integrated circuit comrpising a temperature reference source of known temperature made as a planar resistor for developing a temperature reference signal proportional to the temperature of the temperature reference source, an amplifier in said integrated circuit and switch means for alternatively applying said received signal and said temperature reference signal to said amplifier to develop an output therefrom corresponding to an error signal representative of a difference between the temperature of said object and the temperature of said temperature reference source, detector means receiving outputs of the amplifier for detecting said error signal, a low frequency generator in the integrated circuit for applying a low frequency signal to said switch means for alternately connecting to said amplifier the antenna and said temperature reference source to continuously apply the signal outputs therefrom to said amplifier to compare the physical temperatures of said body and said temperature reference source, heat control means in said integrated circuit comprising heatable resistors for controlling the application of heat to said planar resistor of said temperature reference source for varying the physical temperature thereof, sychronizing means receptive of the error signal from the detector means for synchronizing application of the error signal from the detector to said heat control means and which is directly proportional to the temperature difference between said body and the temperature reference source thereby to obtain a nil error signal so that the temperature of the temperature reference source will thereby correspond to the temperature of said object.

2. A device for measuring thermal microwave radiation of an object for measuring the internal physical temperature of the object including a human or animal body comprising, an antenna to pickup thermal microwave electromagnetic radiation of the object and convert it into a received signal proportional to the temperature of the object, a temperature reference source for developing a temperature reference signal proportional to the temperature of the temperature reference source, an amplifier, switch means for alternatively applying said received signal and said temperature reference signal to said amplifier to develop an output therefrom corresponding to an error signal representative of a difference between the temperature of said object and the temperature of said temperature reference source, detector means receiving outputs of the amplifier for detecting said error signal, a low frequency generator for applying a low frequency signal to said switch means for alternatively connecting to said amplifier the antenna and said temperature reference source to continuously apply the signal outputs therefrom to said amplifier to compare the physical temperatures of said body and said temperature reference source, heat control means for controlling the application of heat to said temperature reference source for varying the physical temperature thereof, synchronizing means receptive of the error signal from the detector means for synchronizing application of the error signal from the detector to said heat control means which is directly proportional to the temperature difference between said body and the temperature reference source thereby to obtain a nil error signal so that the temperature of the temperature reference source will thereby correspond to the temperature of said object, and impedance adjustment control means for effectively applying an impedance of known value in parallel with input terminals of said amplifier alternatively during intervals when the amplifier is in circuit with said antenna and said temperature reference source thereby to vary the impedance seen by the amplifier.

3. A device for measuring thermal microwave radiation of an object for measuring the internal physical temperature of the object including a human or animal body according to claim 2, in which said impedance adjustment control means comprises another switch means for connecting a capacitance or resistance of known value in parallel with said input terminals of the amplifier.

4. A device for measuring thermal microwave radiation of an object for measuring the internal physical temperature of the object including a human or animal body comprising, an antenna to pickup thermal microwave electromagnetic radiation of the object and convert it into a received signal proportional to the temperature of the object, a temperature reference source of known temperature for developing a temperature reference signal proportional to the temperature of the temperature reference source, an amplifier, switch means for alternatively applying said received signal and said temperature reference signal to said amplifier to develop an output therefrom corresponding to an error signal representative of a difference between the temperature of said object and the temperature of said temperature reference source, detector means receiving outputs of the amplifier for detecting said error signal to said switch means for alternately connecting to said amplifier the antenna and said temperature reference source to continuously apply the signal outputs therefrom to said amplifier to compare the physical temperatures of said body and said temperature reference source, heat control means for controlling the application of heat to said temperature reference source for varying the physical temperature thereof, synchronizing means receptive of the error signal from the detector means for synchronizing application of the error signal from the detector to said heat control means and which is directly proportional to the temperature difference between said body and the temperature reference source thereby to obtain a nil error signal so that the known temperature of the temperature reference source will thereby correspond to the temperature of said object, means to insure said antenna and said temperature reference source are effectively impedance matched comprising means for detecting a second error signal corresponding to an impedance signal proportional to the difference to impedance between the antenna and said temperature reference source, and means for modifying the impedance of said reference temperature source in dependence upon said impedance signal to effectively match the impedances of said antenna and said temperature reference source.

5. A device for measuring thermal microwave radiation of an object for measuring the internal physical temperature of an object including a human or animal body according to claim 4, in which said device comprises a monolithic integrated circuit consisting of epitaxy layers $n+n$ on semi-insulation applied as a semiconductor of the 111-V type such as AsGa.

6. A device for measuring thermal microwave radiation of an object for measuring the internal physical temperature of an object including a human or animal body according to claim 5, in which said temperature reference source comprises a planar resistor comprising an epitaxy layer, and two ohmic contacts between which said resistor is disposed.

7. A device for measuring thermal microwave radiation of an object for measuring the internal physical temperature of an object including a human or animal body according to claim 5, in which said amplifier comprises a transistor cascade having capacative connections connecting to a grid of the next successive stage, and the transistors consisting of field effect transistors decreasing in width.

8. A device for measuring thermal microwave radiation of an object for measuring the internal physical temperature of an object including a human or animal body according to claim 6, in which said means for modifying the impedance of said resistor comprises a Schottky contact grid the applied voltage of which is made to vary.

9. A device for measuring thermal microwave radiation of an object for measuring the internal physical temperature of an object including a human or animal body according to claim 8, in which heating resistors arranged in the immediate vicinity of said resistor heat the resistor under control of said heat control means.

10. A device for measuring thermal microwave radiation of an object for measuring the internal physical temperature of an object including a human or animal body according to claim 9, including means for sensing the temperature of said temperature reference source comprises detecting the voltage current changes of a semi-conductor metal contact thereof.

* * * * *